United States Patent
Amemiya

(10) Patent No.: US 11,182,921 B2
(45) Date of Patent: Nov. 23, 2021

(54) WIRE SHAPE INSPECTING APPARATUS AND WIRE SHAPE INSPECTING METHOD

(71) Applicant: SHINKAWA LTD., Tokyo (JP)

(72) Inventor: Shigeru Amemiya, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 16/955,785

(22) PCT Filed: Dec. 20, 2018

(86) PCT No.: PCT/JP2018/047043
§ 371 (c)(1),
(2) Date: Aug. 26, 2020

(87) PCT Pub. No.: WO2019/124508
PCT Pub. Date: Jun. 27, 2019

(65) Prior Publication Data
US 2020/0388046 A1  Dec. 10, 2020

(30) Foreign Application Priority Data
Dec. 20, 2017  (JP) .............................. JP2017-244338

(51) Int. Cl.
*G06T 7/00* (2017.01)
*G06T 7/62* (2017.01)
*G06T 7/571* (2017.01)

(52) U.S. Cl.
CPC ............... *G06T 7/62* (2017.01); *G06T 7/571* (2017.01); *G06T 7/97* (2017.01); *G06T 2207/30136* (2013.01); *G06T 2207/30148* (2013.01)

(58) Field of Classification Search
CPC .. G06T 7/62; G06T 7/97; G06T 7/571; G06T 7/586; G06T 7/001; G06T 2207/30136;
(Continued)

(56) References Cited

U.S. PATENT DOCUMENTS

| | | | | |
|---|---|---|---|---|
| 5,347,362 A | * | 9/1994 | Sugawara | ............... H01L 24/85 356/625 |
| 5,901,241 A | | 5/1999 | Koljonen et al. | |
| 2012/0024089 A1 | * | 2/2012 | Couey | .................. B23K 20/004 73/865.8 |

FOREIGN PATENT DOCUMENTS

| | | |
|---|---|---|
| JP | H05160233 | 6/1993 |
| JP | H05312532 | 11/1993 |

(Continued)

OTHER PUBLICATIONS

"International Search Report (Form PCT/ISA/210) of PCT/JP2018/047043," dated Feb. 26, 2019, with English translation thereof, pp. 1-3.

(Continued)

*Primary Examiner* — Chan S Park
*Assistant Examiner* — Claude Noel Y Zanetsie
(74) *Attorney, Agent, or Firm* — JCIPRNET

(57) ABSTRACT

This wire shape inspecting apparatus comprises a camera which captures an image of a wire from above, a light which illuminates the wire from above, and a control unit, wherein the control unit performs: an inspection image acquiring process of acquiring a plurality of inspection images by causing the camera to capture images of the wire a plurality of times while changing a focal distance; and a first shape detecting process of identifying, in each inspection image, a light emitting portion, which is an image part including reflected light comprising light from the light that has been reflected by the wire, and identifying an actual light emitting portion position, which is the actual position of the light emitting portion, on the basis of the position of the light emitting portion in the inspection image and the focal distance when the inspection image was acquired.

6 Claims, 9 Drawing Sheets

(58) Field of Classification Search
CPC . G06T 2207/30148; G06T 2207/30141; G06T 2207/10148; H01L 2224/859; H01L 2224/48091; H01L 2224/48465; G01B 11/24

See application file for complete search history.

(56) References Cited

FOREIGN PATENT DOCUMENTS

| | | | | |
|---|---|---|---|---|
| JP | H05312532 A | * | 11/1993 | ............. H01L 24/78 |
| JP | H06224267 | | 8/1994 | |
| JP | 2014013144 | | 1/2014 | |
| JP | 5685353 | | 3/2015 | |

OTHER PUBLICATIONS

"Office Action of China Counterpart Application", dated Jun. 22, 2021, with English translation thereof, p. 1-p. 21.

* cited by examiner

WIRE SHAPE INSPECTING APPARATUS AND WIRE SHAPE INSPECTING METHOD

CROSS-REFERENCE TO RELATED APPLICATION

This application is a 371 application of the International PCT application serial no. PCT/JP2018/047043, filed on Dec. 20, 2018, which claims the priority benefits of Japan Patent Application No. 2017-244338, filed on Dec. 20, 2017. The entirety of each of the above-mentioned patent applications is hereby incorporated by reference herein and made a part of this specification.

BACKGROUND

Technical Field

The present invention discloses a wire shape inspecting apparatus and a wire shape inspecting method to inspect the shape of a wire which is bonded between a semiconductor chip and a mounted body.

Related Art

Conventionally, wire bonding for mounting a semiconductor chip on a mounted body by bonding a wire between the semiconductor chip and the mounted body (a substrate or another semiconductor chip) has been widely known. Patent literature 1 discloses that after performing such wire bonding, a post bond inspection (PBI) is performed to inspect whether each part of the wire loop is accurately wire-bonded to a given bonding position. By performing the post bond inspection, the reliability of a semiconductor apparatus that is manufactured can be further improved.

Meanwhile, in order to perform the post bond inspection, it is evidently necessary to detect the shape of the wire. Conventionally, the shape of the wire was often detected mainly by a method called the focus method. In the focus method, on the basis of a focal distance when capturing an image and the position (coordinate) of a portion in focus (focused portion) in the image, the position of the focused portion in reality is identified. When the shape of the wire is detected by the focus method, the image of the wire is captured a plurality of times while changing the focal distance. Then, for each image, the coordinate of the focused portion of the wire that is in focus is identified, and on the basis of the coordinate and the focal distance when capturing the image, the actual position of the focused portion, that is, a part of the bonding wire is identified. Then, the shape of the wire is identified by connecting the actual position of the focused portion in each of the plurality of images.

Literature of Related Art

Patent Literature

Patent literature 1: Japanese Patent No. 5685353

SUMMARY

Problems to be Solved

However, the focus method can be applied only to the area of the wire that is observable by a camera. That is, in general, the bonding wire often has a lateral portion observable by the camera, and a neck portion located on the back side of the lateral portion when viewed from the camera. In this case, the neck portion is hidden by the lateral portion and cannot be observed by the camera. Therefore, there was a problem that the shape of the lateral portion cannot be detected by the focus method.

Thus, the present invention discloses a wire shape inspecting apparatus and a wire shape inspecting method which can detect the shape of the wire more reliably.

Means to Solve the Problems

The present invention discloses a wire shape inspecting apparatus which inspects a shape of a wire bonded between a semiconductor chip and a mounted body. The wire shape inspecting apparatus includes: a camera, which captures images of a wire to be inspected from a first direction; a light, which illuminates the wire to be inspected from the first direction; and a control portion, which controls the driving of the camera and the light, and identifies the shape of the wire on the basis of the images captured by the camera. The control portion performs: an inspection image acquiring processing, in which a plurality of inspection images are acquired by causing the camera to capture images of the wire to be inspected a plurality of times while changing a focal distance; and a first shape detecting processing, in which a light emitting portion which is an image part of reflected light where light from the light is reflected by the wire is identified in the inspection image, the position of the light emitting portion in the inspection image is identified as a light emitting portion coordinate, and an actual light emitting portion position which is the position of the light emitting portion in reality is identified on the basis of the focal distance when the inspection image is acquired and the light emitting portion coordinate.

With the above configuration, the position of the wire is identified by using the image of the reflected light (light emitting portion), so that the shape can be reliably detected even in a portion where the edge cannot be visually recognized directly by the camera.

In addition, the wire may have a lateral portion observable by the camera and a neck portion located on a back side of the lateral portion when viewed from the camera, and the control portion may detect the shape of the neck portion by the first shape detecting processing.

With the above configuration, the shape of the neck portion can also be reliably detected.

In this case, the control portion may further performs a second shape detecting processing in which the position in reality of a focused portion where the image of the wire becomes clear is identified in the inspection image as an actual focused portion position on the basis of the position of the focused portion in the image and the focal distance when the inspection image is acquired, and the control portion may detect the shape of the lateral portion by the second shape detecting processing.

With the above configuration, the shape of the lateral portion is detected by the focus method, so that the shape of the lateral portion can be detected easily and with high precision.

In addition, the light may have one or more first light sources disposed on a first circle concentric with the camera, and one or more second light sources disposed on a second circle concentric with the camera and having a larger diameter than the first circle, the control portion may light the first light sources when the inspection image used in the first shape detecting processing is captured, and may light the second light sources when the inspection image used in the second shape detecting processing is captured.

With the above configuration, during the first shape detecting processing, the images are captured when the first light source close to the camera is lighted, so that the light reflected on the peripheral surface of the wire enters the camera more reliably. As a result, in a first inspection image, the light emitting portion is imaged more reliably, and the shape of the wire can be detected more reliably.

In addition, a change interval of the focal distance of a plurality of inspection images used in the first shape detecting processing may be set narrower than a change interval of the focal distance of a plurality of inspection images used in the second shape detecting processing.

With the above configuration, the change in the position of the neck portion in the first direction can be detected more reliably.

The present invention discloses a wire shape inspecting method which inspects a shape of a wire laid between a semiconductor chip and a mounted body. The wire shape inspecting method includes: an arrangement step, in which a camera for capturing images of a wire to be inspected from a first direction is arranged and a light for illuminating the wire to be inspected from the first direction is arranged; an inspection image acquiring step, in which a plurality of inspection images are acquired by causing the camera to capture images of the wire to be inspected a plurality of times while illuminating the wire to be inspected by the light and changing a focal distance; a first shape detecting step, in which a light emitting portion which is an image part of reflected light where light from the light is reflected by the wire is identified in the inspection image, the position of the light emitting portion in the inspection image is identified as a light emitting portion coordinate, the actual light emitting portion position which is the position of the light emitting portion in reality is identified on the basis of the focal distance when the inspection image is acquired and the light emitting portion coordinate, and the shape of the wire is detected on the basis of a plurality of actual light emitting portion positions that are identified in the plurality of inspection images.

With the above configuration, the position of the wire is identified by using the image of the reflected light (light emitting portion), so that the shape can be reliably detected even in the portion where the edge cannot be visually recognized directly by the camera.

Effect

According to the wire shape inspecting apparatus and the wire shape inspecting method disclosed in the present invention, the position of the wire is identified by using the image of the reflected light (light emitting portion), so that the shape can be reliably detected even in the portion where the edge cannot be visually recognized directly by the camera.

DESCRIPTION OF THE EMBODIMENTS

Figure 1:
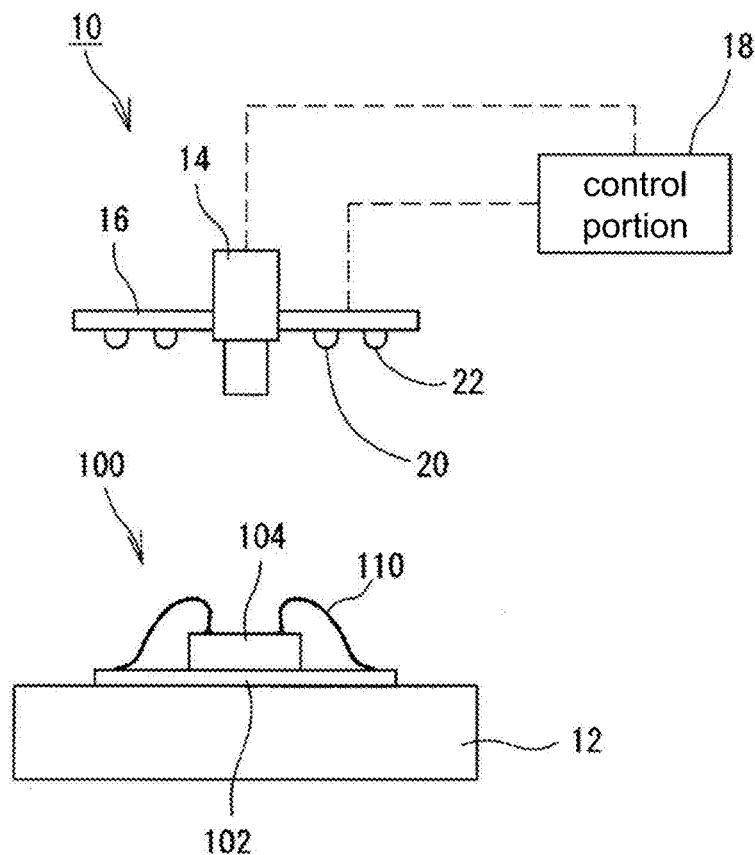
FIG. 1 is a diagram showing the configuration of a wire shape inspecting apparatus.

Next, the configuration of a wire shape inspecting apparatus 10 is described with reference to the drawings. FIG. 1 is a schematic diagram showing the configuration of the wire shape inspecting apparatus 10. The wire shape inspecting apparatus 10 is an apparatus for inspecting the quality of the shape of a bonding wire (hereinafter referred to as "wire 110") laid between a semiconductor chip 104 and a substrate 102. The wire shape inspecting apparatus 10 may be arranged alone or may be incorporated into another apparatus such as a wire bonding apparatus and so on.

The wire shape inspecting apparatus 10 includes a stage 12 on which a semiconductor apparatus 100 to be inspected is mounted, a camera 14 arranged opposite to the stage 12, a light 16 arranged around the camera 14, and a control portion 18 for controlling the driving of the camera 14 and the light 16. The semiconductor apparatus 100 to be inspected is mounted by bonding one or more semiconductor chips 104 onto the substrate 102 by the wire 110. A plurality of wires 110 are bonded to each semiconductor chip 104.

Figure 4:
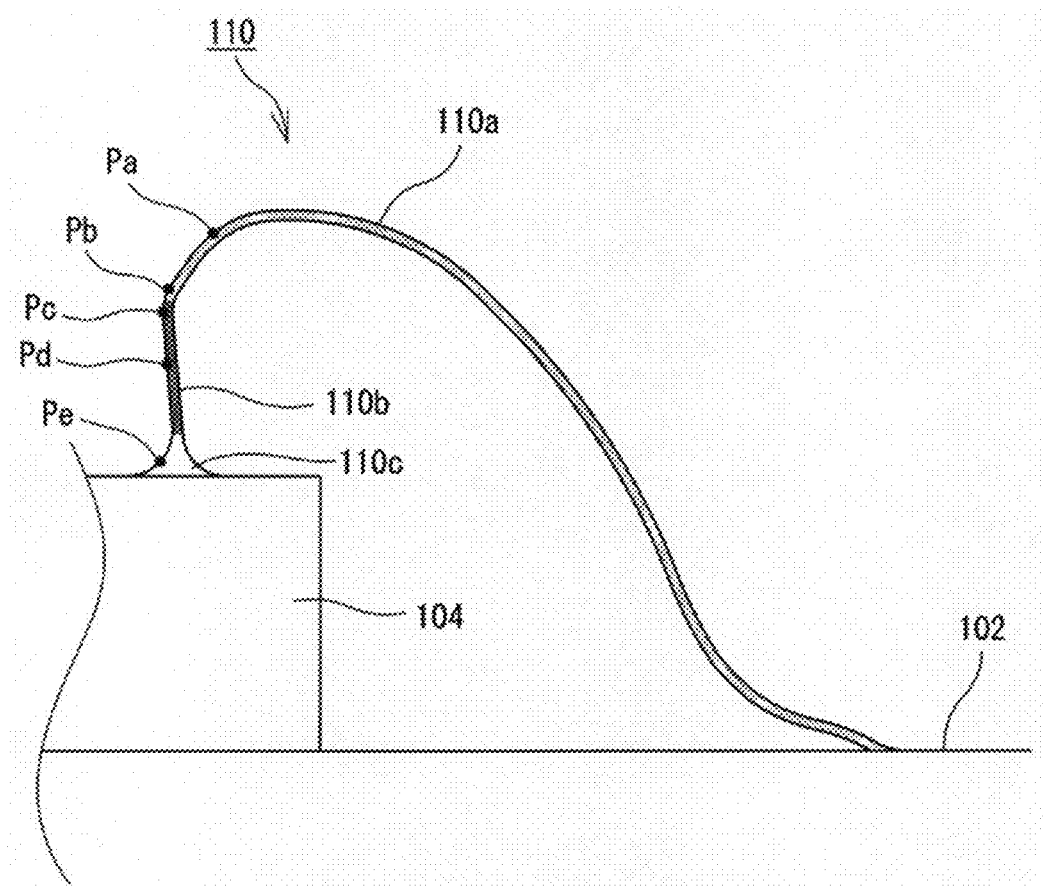
FIG. 4 is a diagram showing an example of the shape of the wire.

FIG. 4 is a diagram showing an example of the shape of the wire 110. As shown in FIG. 4, the wire 110 rises in a substantially vertical direction from the upper surface of the semiconductor chip 104, and then extends in a substantially horizontal or obliquely downward direction toward the substrate 102. In the following description, in the wire 110, the portion visually recognizable from directly above (camera 14), that is, the portion extending in the substantially horizontal or obliquely downward direction, is referred to as "lateral portion 110a". In addition, the portion which is wholly or partly hidden by the lateral portion 110a and is difficult to visually recognize when viewed from directly above (camera 14), that is, the portion extending in the substantially vertical direction, is referred to as "neck portion 110b". Further, the portion that expands in a substantially circular shape in the lower end of the neck portion 110b is referred to as "ball portion 110c". In FIG. 4, a light black portion represents the lateral portion 110a, and a dark black portion represents the neck portion 110b.

Figure 5:
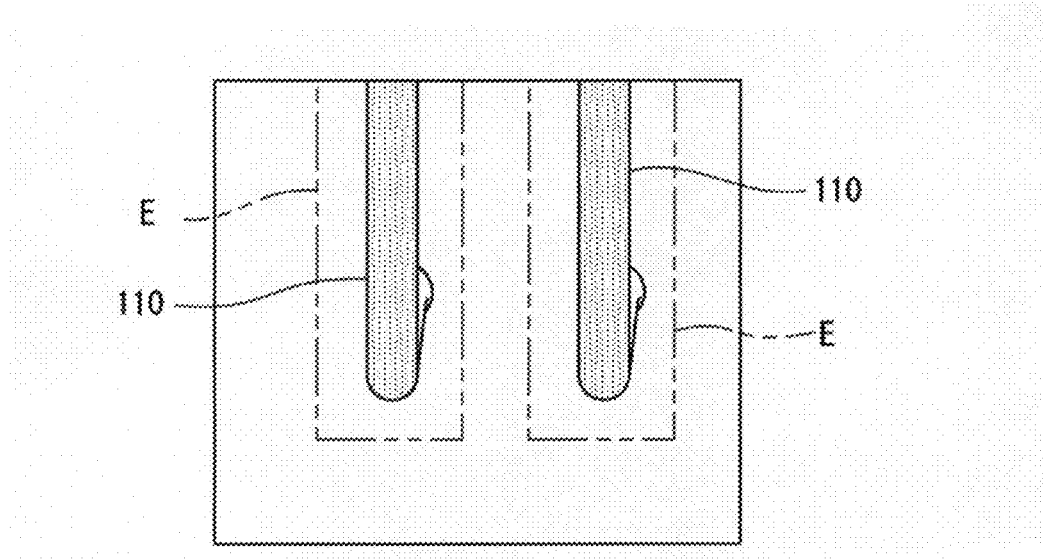
FIG. 5 is a diagram showing an example of an image-capturing area.

The camera 14 consists of, for example, a CCD camera or the like, and acquires inspection images including a part or all of the wire 110 to be captured. FIG. 5 is a diagram showing an example of the image-capturing area of the camera 14. In the example of FIG. 5, the camera 14 can simultaneously capture the image of a part of two wires 110. The optical axis of the camera 14 is approximately parallel to the vertical direction, and the image of each wire 110 can be captured from approximately directly above. The depth of field of the camera 14 is sufficiently smaller than the dimensional precision required for the shape inspection. In addition, it is possible to change the focal distance of the camera 14, during the shape inspection of the wire 110, the image of the wire 110 to be inspected is captured a plurality of times while changing the focal distance.

Figure 2:
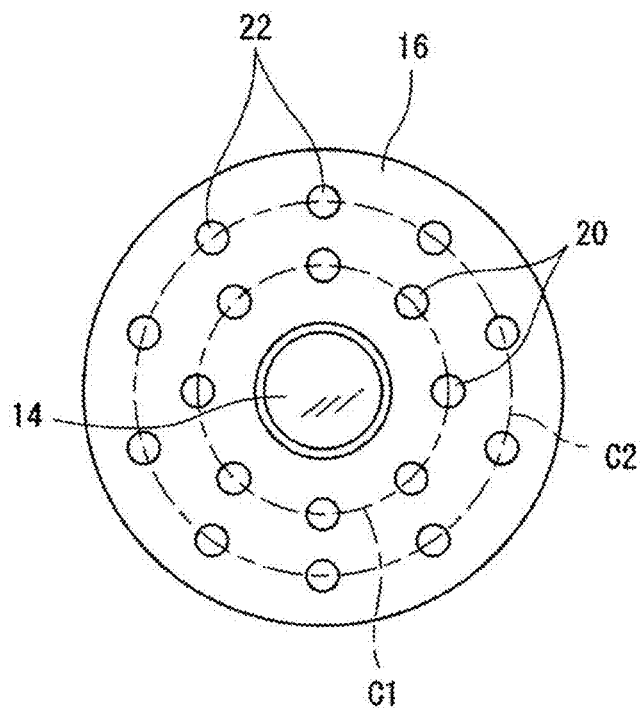
FIG. 2 is an optical axis direction view of a light and a camera.

The light 16 is fixed to the camera 14. The light 16 and the camera 14 can be moved with respect to the stage 12 so that the light 16 and camera 14 can be positioned roughly directly above the wire 110 to be inspected. FIG. 2 is a diagram in which the camera 14 and the light 16 are viewed from the optical axis direction of the camera 14. The light 16 has a plurality of first light sources 20 disposed on a first circle C1, and a plurality of second light sources 22 disposed on a second circle C2. The first circle C1 and the second circle C2 are both concentric with the camera 14, and the second circle C2 has a larger diameter than the first circle C1. In other words, the first light sources 20 are disposed closer to the camera 14 than the second light sources 22. The first light sources 20 and the second light sources 22 consist of, for example, LEDs or the like. As described later, when the image for the shape inspection of the neck portion 110b (first inspection image) is captured, the first light sources 20 are lighted, and when the image for the shape inspection of the lateral portion 110a (second inspection image) is captured, the second light sources 22 are lighted.

The control portion 18 controls the driving of the camera 14 and the light 16, and also inspects the shape of the wire 110 on the basis of the inspection images obtained by image-capturing with the camera 14. The control portion 18 includes, for example, a CPU that performs various calculations, and a storage portion 32 that stores various data or programs.

Figure 3:
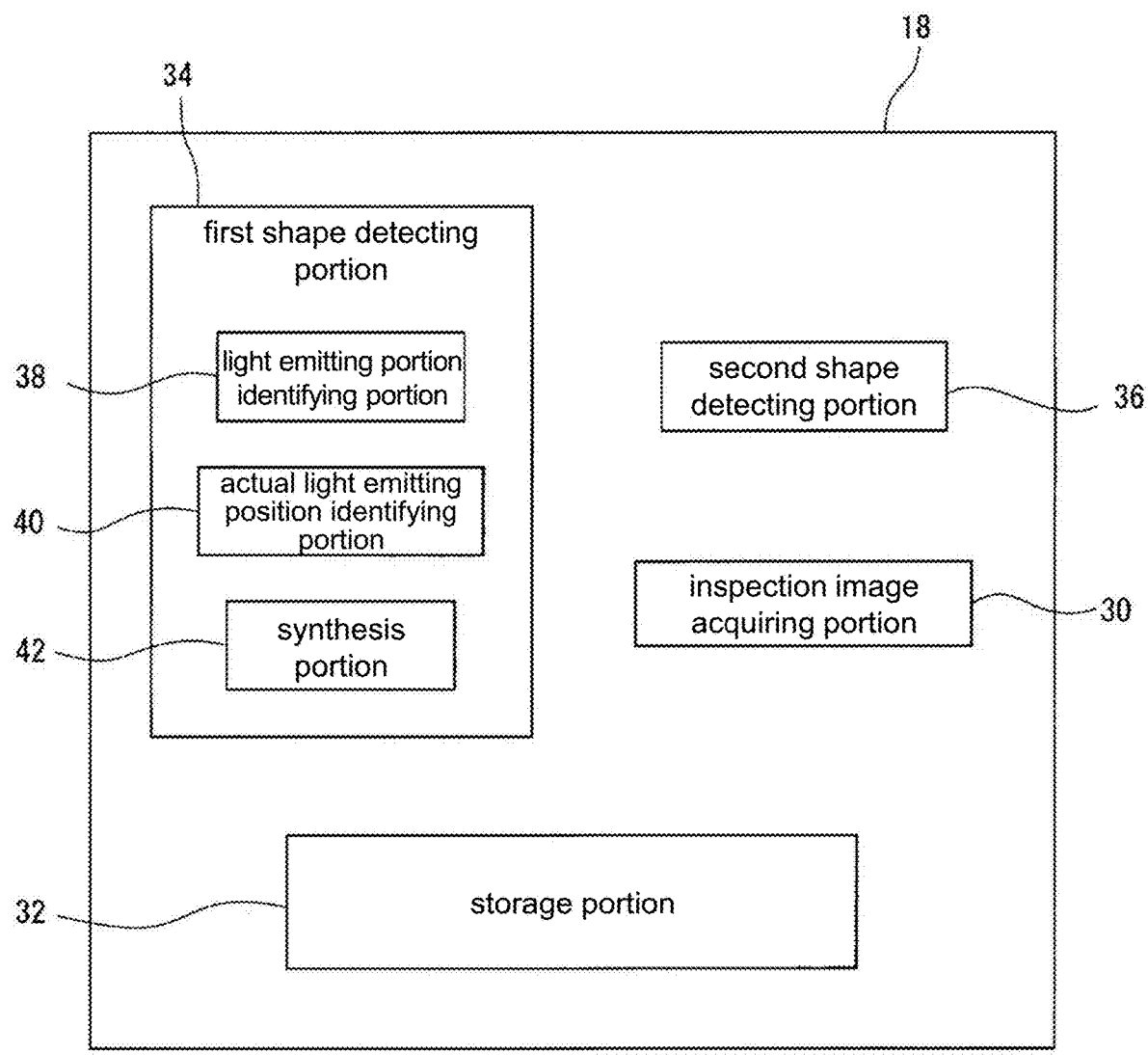
FIG. 3 is a functional block diagram of a control portion.

FIG. 3 is a functional block diagram of the control portion 18. The control portion 18 is functionally divided into an inspection image acquiring portion 30, the storage portion 32, a first shape detecting portion 34, and a second shape detecting portion 36, as shown in FIG. 3.

The inspection image acquiring portion 30 acquires inspection images by capturing images of the wires 110 to be inspected with the camera 14. The inspection image acquiring portion 30 captures the image of one wire 110 a plurality of times while adjusting the focal distance of the camera 14. The captured images are associated with the focal distance during image capturing and are stored in the storage portion 32 as the inspection images.

In the present embodiment, the inspection image used in the shape detection of the neck portion 110b is stored as the first inspection image, and the inspection image used in the shape detection of the lateral portion 110a is stored as the second inspection image. As described later in detail, the first inspection image has a longer focal distance during image capturing and a smaller change interval of the focal distance than the second inspection image. In addition, the first inspection image is the image captured in a state in which the first light sources 20 are lighted and the second light sources 22 are lighted out, and the second inspection image is the image captured in a state in which the second light sources 22 are lighted and the first light sources 20 are lighted out.

The storage portion 32 stores various data or programs. The data stored in the storage portion 32 includes image-capturing conditions (focal distance, camera position, etc.) when the inspection image is captured, inspection image data obtained by capturing images, detected shape data of the wire 110 detected by the shape detecting portions 34 and 36, reference shape data to be compared with detected shape data of the wire 110, and the like. In addition, the stored programs include a program for performing first shape detecting processing and second shape detecting processing which are described later.

The first shape detecting portion 34 performs the first shape detecting processing to detect the shape of the neck portion 110b on the basis of the first inspection image. In addition, the second shape detecting portion 36 performs the second shape detecting processing to detect the shape of the lateral portion 110a on the basis of the second inspection image. Before describing specific configurations of the first shape detecting portion 34 and the second shape detecting portion 36, the first shape detecting processing and the second shape detecting processing are described.

First, the second shape detecting processing is described. The second shape detecting processing is processing for detecting the shape of the wire 110 by a method called the focus method in general. More specifically, in the second shape detecting processing, the image of the wire 110 to be inspected is captured, while changing the focal distance little by little, to acquire a plurality of second inspection images. During the image-capturing, the second light sources 22 are lighted. Here, the focused depth of the camera 14 is sufficiently smaller than the height dimension of the wire 110. Therefore, in the wire 110, only the portion in which the distance from the camera 14 matches the focal distance is clearly imaged (in focus), and other portions are blurred (out of focus). In the second shape detecting processing, the portion of the wire 110 which is in focus in the second inspection image is identified as a focused portion. Then, on the basis of the coordinate value of the focused portion in the image and the focal distance during image-capturing, the actual focused portion position which is the position of the focused portion in reality is identified. The actual focused portion position is calculated for each of a plurality of second inspection images, and the shape of the wire 110 is detected by connecting a plurality of the actual focused portion positions that are obtained.

Furthermore, various methods are considered as the method for identifying the focused portion. For example, the focused portion may be identified from a luminance difference between adjacent pixels in the image. That is, in the portion which is in focus, the edge is clearly imaged and thus the luminance difference between adjacent pixels becomes larger. Therefore, for each pixel of the second inspection image, the luminance difference between adjacent pixels may be calculated, and the portion where the absolute value of the luminance difference exceeds a prescribed threshold may be identified as the focused portion.

In addition, in order to reduce the calculation amount, the calculation of the luminance difference may be limited to only the inspection area in which the wire 110 is assumed to exist in the second inspection image. That is, the approximate position of the wire 110 can be expected. Therefore, as shown in FIG. 5, only the path periphery of the wire 110 in the inspection image may be extracted as an inspection area E, and the luminance difference may be calculated only for the inspection area E.

Next, the first shape detecting processing is described. The first shape detecting processing detects the shape of a portion difficult to be detected by the focus method. Specifically, in the first shape detecting processing, the shape of the neck portion 110b hidden by the lateral portion 110a and invisible from the camera 14 is detected. In the first shape detecting processing, as in the second shape detecting processing, the image of the wire 110 to be inspected is captured while changing the focal distance little by little to acquire a plurality of first inspection images. However, during the image-capturing, the first light sources 20 are lighted instead of the second light sources 22.

Figure 6:
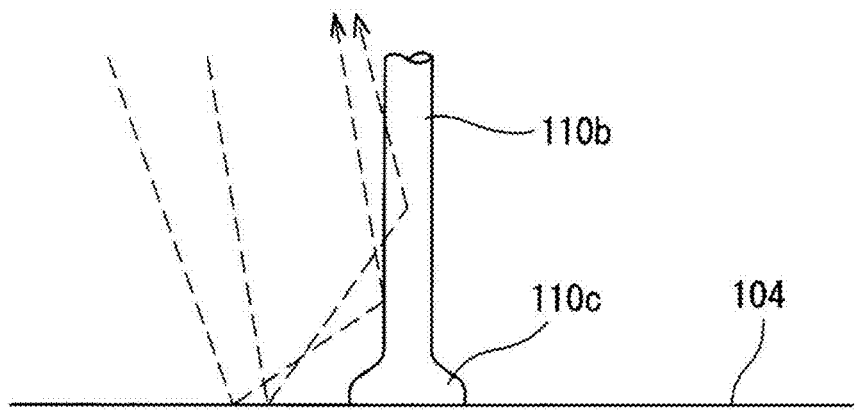
FIG. 6 is a conceptual diagram showing a state in which light is reflected on a neck portion.

The first light sources 20 are closer to the camera 14 than the second light sources 22. Therefore, the light of the first light sources 20 reflected by the peripheral surface of the neck portion 110b enters the camera 14 easily. That is, as shown in FIG. 6, the light from the first light sources 20 falls on the upper surface of the semiconductor chip 104 near the neck portion 110b with a relatively steep slope. The light that falls on the upper surface of the semiconductor chip 104 reflects, then falls on the peripheral surface of the neck portion 110b and reflects upward with a relatively steep slope again. That is, by illuminating the wire 110 with the first light sources 20 disposed near the camera 14, the reflected light reflected by the peripheral surface of the neck portion 110b easily enters the camera 14 located above. As a result, in the first inspection image obtained by image-capturing with the camera 14, the light emitting portion which is an image of the light reflected by the wire 110, particularly by the neck portion 110b is imaged. Here, although the light of the first light sources 20 reflects at various height positions of the neck portion 110b, what is imaged in the first inspection image is the reflected light at the height position where the focal distance matches. Therefore, if the position in image of the light emitting portion 50 imaged in the first inspection image and the focal distance during image-capturing are known, the actual position of the light emitting portion, that is, the position of the peripheral surface of the neck portion 110b can be identified.

Figure 7A:
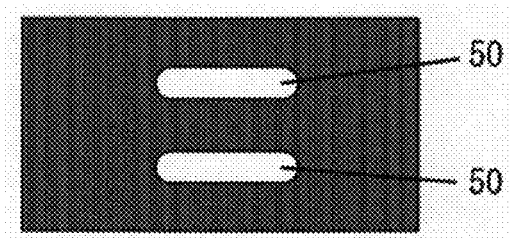
FIG. 7A is a conceptual diagram of an image obtained when point Pa of FIG. 4 is in focus.
Figure 7B:
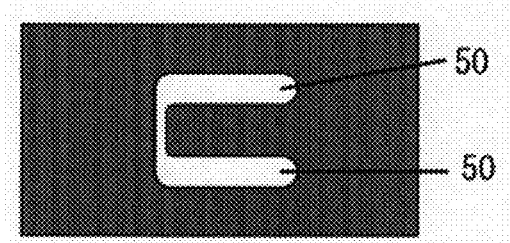
FIG. 7B is a conceptual diagram of an image obtained when point Pb of FIG. 4 is in focus.

FIG. 7A to FIG. 7E are diagrams showing examples of the shape of the light emitting portion 50. FIG. 7A shows the light emitting portion 50 at point Pa in FIG. 4. That is, the light emitting portion 50 imaged in the image captured when focusing in the point Pa is shown. Similarly, FIG. 7B to FIG. 7E show the light emitting portion 50 at the points Pb to Pe in FIG. 4.

Figure 7C:
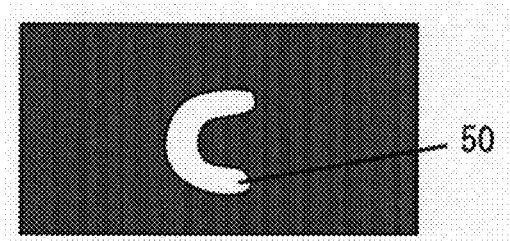
FIG. 7C is a conceptual diagram of an image obtained when point Pc of FIG. 4 is in focus.
Figure 7D:
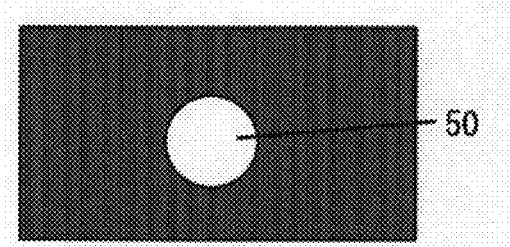
FIG. 7D is a conceptual diagram of an image obtained when point Pd of FIG. 4 is in focus.
Figure 7E:
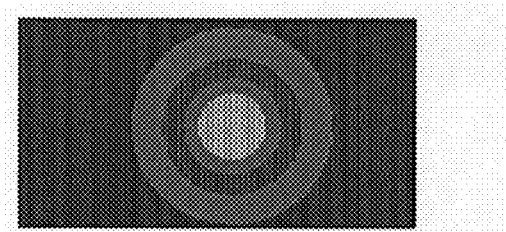
FIG. 7E is a conceptual diagram of an image obtained when point Pe of FIG. 4 is in focus.

As is clear from FIG. 7A to FIG. 7E, in the lateral portion 110a, only the periphery of the edge of the wire 110 is brightly reflected. As a result, in the image, two lumps of light (light emitting portion 50) that are completely separated or partially connected are imaged. In this way, the shape detection (second shape detecting processing) using the focus method can be performed on the portion where two light emitting portions 50 are imaged. In addition, in the periphery of the ball portion 110c, the reflected light is easy to orient in the horizontal direction and thus is not prone to enter the camera 14. As a result, when point Pe is in focus, as shown in FIG. 7E, an entirely dark image without the light emitting portion 50 is obtained.

Meanwhile, in the neck portion 110b which is hidden by the lateral portion 110a and is hardly visible, it seems that the peripheral surface of the wire 110 emits bright light in the image. As a result, in the image, as shown in FIG. 7C and FIG. 7D, one lump of light (light emitting portion 50) that is a substantially C shape or a substantially circular shape is imaged. In the first shape detecting processing, if one light emitting portion 50 as described above exists at a position where the wire 110 is expected to exist, it is determined that the wire 110 exists in the light emitting portion 50. Then, the position of the light emitting portion 50 in reality (actual light emitting portion position) is identified on the basis of the coordinate of the light emitting portion 50 in the image (light emitting portion coordinate), and the focal distance during image-capturing.

Figure 8:
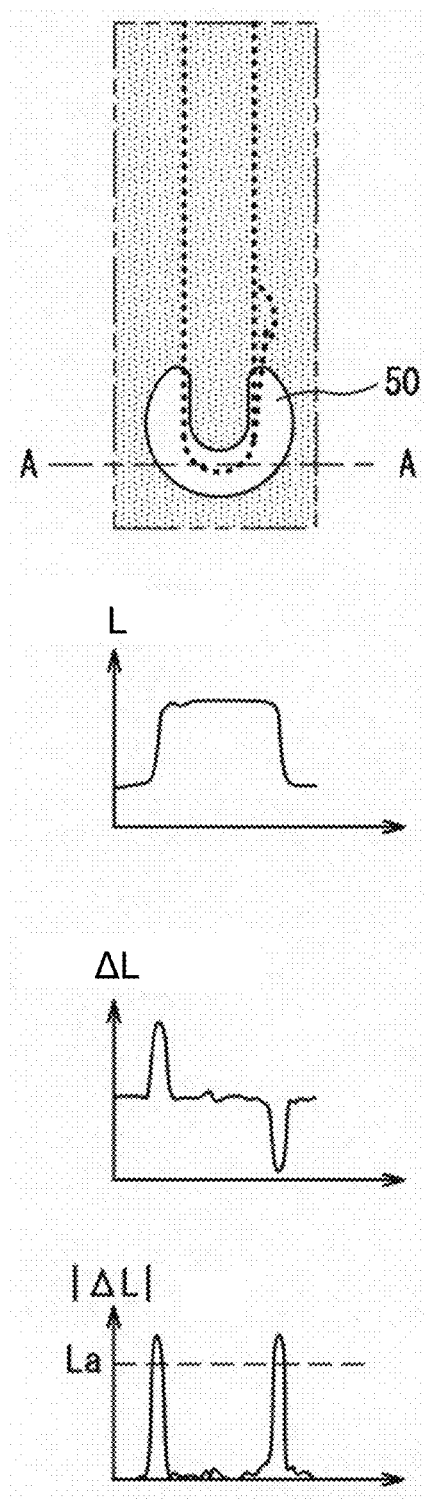
FIG. 8 is a conceptual diagram showing a specific state of a light emitting portion.

The first shape processing portion is specifically described with reference to FIG. 8. In FIG. 8, the first row is a conceptual image in which only the inspection area E is extracted from the first inspection image. The second row shows the luminance value L along line A-A, the third row shows the luminance difference $\Delta L$ with an adjacent pixel, the forth row shows the absolute value $|\Delta L|$ of the luminance difference.

As shown in FIG. 8, in the first inspection image, only the portion where the light of the first light sources 20 is reflected by the neck portion 110b is imaged brightly, and the other portions are imaged dimly. As a result, the luminance value L changes greatly between the light emitting portion 50 and portions other than the light emitting portion 50. In the first shape detecting processing, the luminance value L for each pixel of the first inspection image is acquired, and the absolute value $|\Delta L|$ of the luminance difference with an adjacent pixel is further calculated. Then, the pixel portion whose absolute value $|\Delta L|$ of the luminance difference is equal to or greater than a prescribed threshold La is extracted as a boundary of the light emitting portion 50. Furthermore, the shape of the light emitting portion 50 can be identified by extracting the boundary of the light emitting portion 50 for each column. Furthermore, although the shape of the light emitting portion 50 is identified on the basis of the absolute value $|\Delta L|$ of the luminance difference here, the shape of the light emitting portion 50 can also be identified by other methods. For example, the light emitting portion 50 may be extracted by binarizing the obtained first inspection image on the basis of the luminance value L.

If the shape of the light emitting portion 50 can be identified, then the representative coordinate showing the position of the light emitting portion 50 in the image is required as the light emitting portion coordinate. As the light emitting portion coordinate, for example, a centroid point (image center point) of the light emitting portion 50, a central point of the circumscribed circle of the light emitting portion 50, or the like can be used. If the light emitting portion coordinate can be calculated, then the position of the light emitting portion 50 in reality can be calculated as the actual light emitting portion position on the basis of the light emitting portion coordinate and the focal distance during image-capturing. That is, the distance from the camera 14 to the light emitting portion 50, and even the vertical direction position of the light emitting portion 50 can be identified on the basis of the focal distance. In addition, the horizontal direction position of the light emitting portion 50 in reality can be identified on the basis of the light emitting portion coordinate and the position of the camera 14 in reality. Then, if the vertical direction position of the light emitting portion 50 is combined with the horizontal direction position of the light emitting portion 50, the position of the light emitting portion 50 in reality, that is, the actual light emitting portion position can be identified. The actual light emitting portion position can be regarded as a position where a part of the neck portion 110b of the wire 110 actually exists. Therefore, by connecting the actual light emitting portion position obtained for each of a plurality of first inspection images, the shape of the neck portion 110b of the wire 110 can be obtained.

Figure 9:
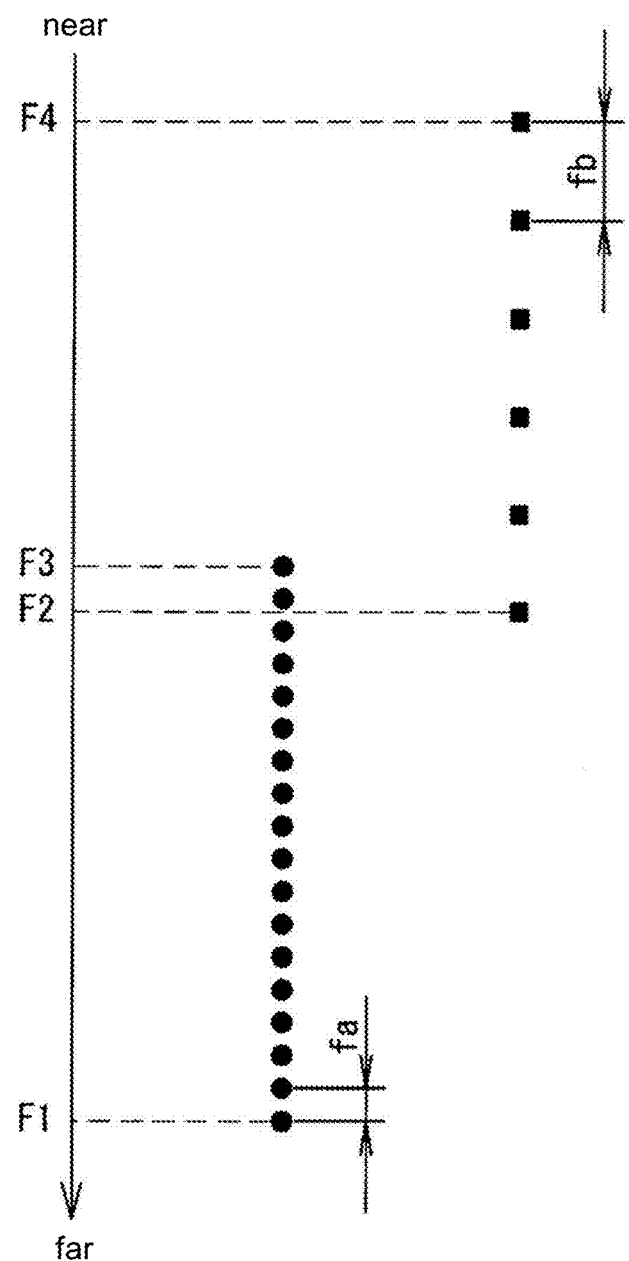
FIG. 9 is a diagram describing a focal distance when an inspection image is captured.

Furthermore, as described above, the change interval of the focal distance of a plurality of inspection images used in the first shape detecting processing is narrower than the change interval of the focal distance of a plurality of inspection images used in the second shape detecting processing. FIG. 9 is a diagram showing an example of the focal distance when the inspection image is captured. In FIG. 9, black circles show the focal distance when the first inspection image is captured, and black squares show the focal distance when the second inspection image is captured. As is clear from FIG. 9, when the first inspection image is captured, the image-capturing is performed while the focal distance changes between a first distance F1 and a third distance F3 by an interval fa. The first distance F1 is a focal distance capable of focusing below the lower end of the neck portion 110b. The third distance F3 is a focal distance smaller (closer) than the first distance F1 and capable of focusing above the upper end of the neck portion 110b. The interval fa is a value equal to or less than the resolution required in the shape detection of the neck portion 110b.

When the second inspection image is captured, the image-capturing is performed while the focal distance changes between a second distance F2 and a fourth distance F4 by an interval fb. The second distance F2 is a focal distance capable of focusing below the upper end of the neck portion 110b and is a focal distance which satisfies F1>F2>F3. The fourth distance F4 is a focal distance capable of focusing above the upper end of the lateral portion 110a and is a focal distance which satisfies F3>F4. The value of the interval fb is larger than the value of the interval fa. The reason is that the lateral portion 110a has a smaller change in the height direction than the neck portion 110b.

The first shape detecting portion 34 is described with reference to FIG. 3 again. The first shape detecting portion 34 is a portion for performing the first shape detecting processing described above. The first shape detecting portion 34 is divided roughly into a light emitting portion identifying portion 38, an actual light emitting position identifying portion 40, and a synthesis portion 42. The light emitting portion identifying portion 38 identifies the light emitting portion 50 in the first inspection image, and further identifies the coordinate of the identified light emitting portion 50 in the image, that is, the light emitting portion coordinate. The actual light emitting position identifying portion 40 identifies the actual light emitting position on the basis of the light emitting portion coordinate and the focal distance of the image from which the light emitting portion coordinate is obtained. The synthesis portion 42 connects the actual light emitting position obtained for each of a plurality of the first detection images to detect the shape of the wire 110.

Figure 10:
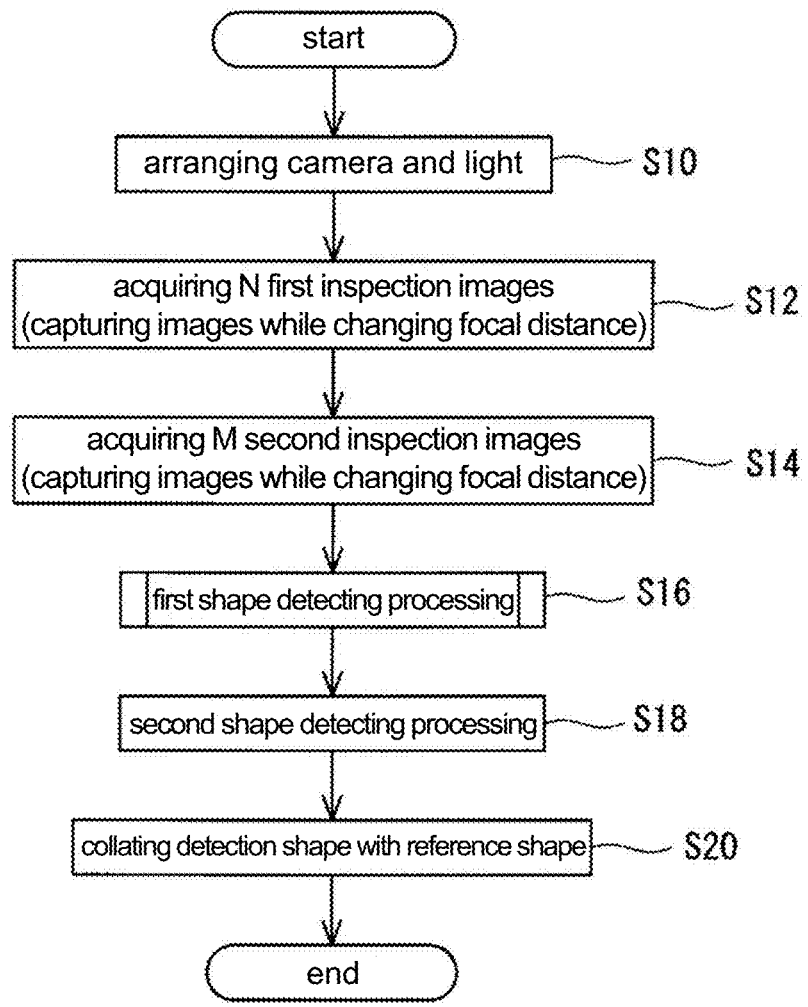
FIG. 10 is a flowchart showing the flow of the wire shape inspection.

Next, the flow of the wire shape inspection by the wire shape inspecting apparatus 10 is described with reference to FIG. 10. FIG. 10 is a flowchart showing the flow of the wire shape inspection. When the wire shape inspection is performed, first, the camera 14 and the light 16 are arranged above the wire 110 to be inspected (S10). Then, N first inspection images are acquired (S12). Specifically, with the first light sources 20 lighted, the image of the wire 110 to be inspected is captured while changing the focal distance between the first distance F1 and the third distance F3 by the interval fa. The image data obtained by capturing images are stored as the first inspection image in the storage portion 32 in association with the focal distance during image-capturing.

In addition, M second inspection images are also acquired (S14). Specifically, with the second light sources 22 lighted, the image of the wire 110 to be inspected is captured while changing the focal distance between the second distance F2 and the fourth distance F4 by the interval fb. The image data obtained by capturing images are stored as the second inspection image in the storage portion 32 in association with the focal distance during image-capturing.

Figure 11:
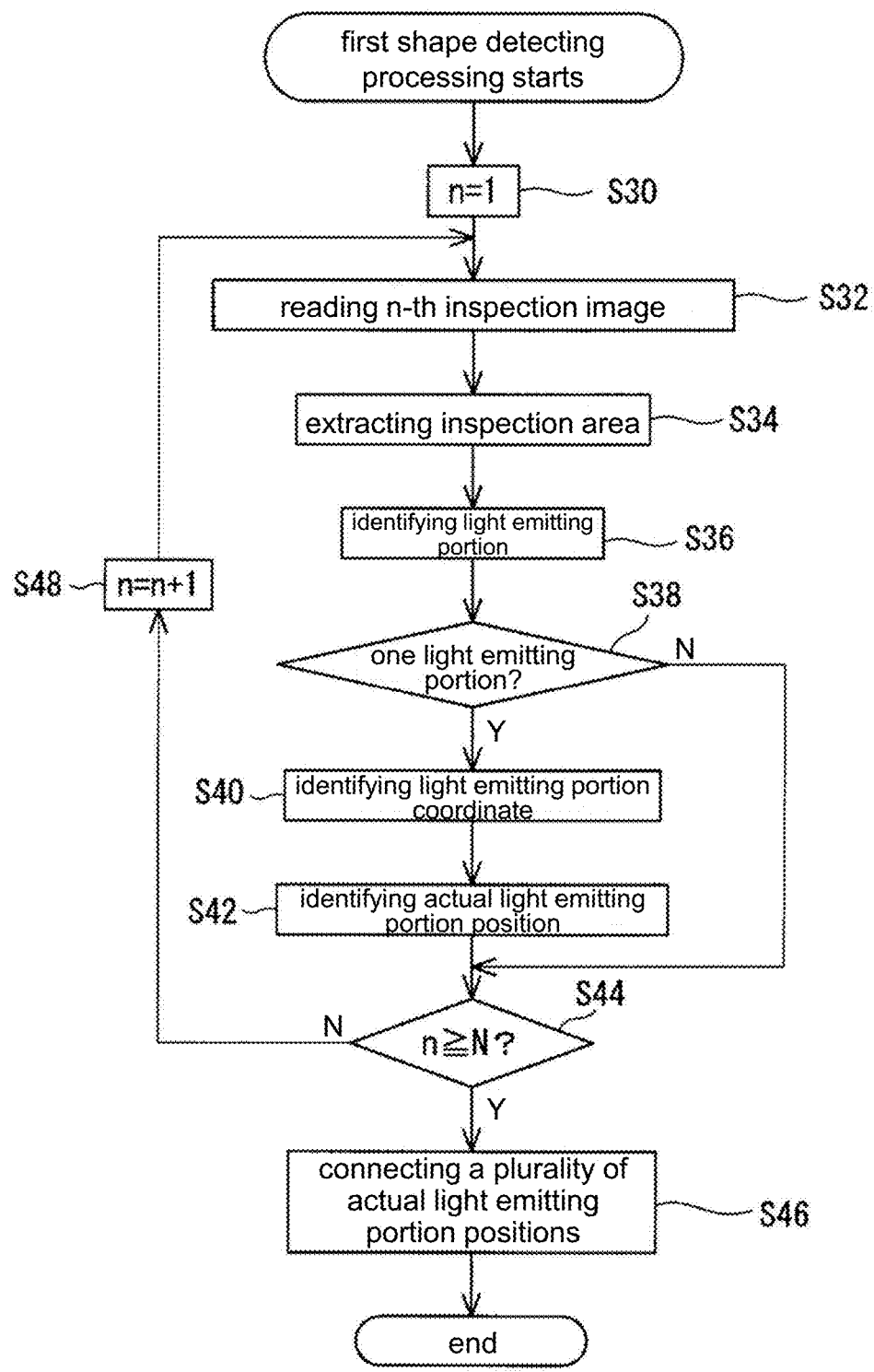
FIG. 11 is a flowchart showing the flow of first shape detecting processing.

If the inspection image can be acquired, then the first shape detecting processing is performed (S16). FIG. 11 is a flowchart showing the flow of the first shape detecting processing. In the first shape detecting processing, first, n is set to 1 (S30), and then the n-th first inspection image is read (S32). Next, only the inspection area E is extracted from the first inspection image (S34). The coordinates that determine the inspection area E are previously determined and stored in the storage portion 32. Then, by extracting only the inspection area E in this way, the calculation amount can be significantly reduced.

Next, the light emitting portion 50 is identified in the inspection area E (S36). Specifically, for each of a plurality of pixels included in the inspection area E, the absolute value |ΔL| of the luminance difference with the adjacent pixel is calculated. Then, on the basis of the obtained absolute value |ΔL| of the luminance difference, a lump portion of light having high luminance, that is, the light emitting portion 50 is identified.

Then, the control portion 18 determines whether the number of the light emitting portion 50 is one or not (S38). When the number of the light emitting portion 50 is two or more or zero, it can be determined that the n-th first inspection image is not suitable for the first shape detecting processing. Therefore, in this case, the processing proceeds to step S44 without identifying the light emitting portion coordinate and the actual light emitting portion position (S40, S42). Meanwhile, when one light emitting portion 50 is included in one inspection area E, the control portion 18 identifies the representative coordinate of the light emitting portion 50, that is, the light emitting portion coordinate (S40). If the light emitting portion coordinate can be identified, then the control portion 18 identifies the position of the light emitting portion 50 in reality and the actual light emitting position of the light emitting portion 50 on the basis of the light emitting portion coordinate value and the focal distance during image-capturing (S42).

If the actual light emitting position can be identified, it is determined whether n≤N is satisfied or not (S44). If the result of the determination is n<N, the value n is incremented (S48) and steps S32 to S44 are repeated. Meanwhile, if the result of the determination is n≥N, that is, if the actual light emitting position can be identified for all of the N pieces of the first inspection images, the control portion 18 connects the plurality of actual light emitting positions that are obtained to form the shape of the neck portion 110b (S46).

Return to FIG. 10 for description. When the first shape detecting processing (S16) is completed, then the control portion 18 performs the second shape detecting processing (S18). Because the processing is performed by the focus method which has been known conventionally, the detailed description is omitted here. In any case, the shape of the lateral portion 110a is detected by performing the second shape detecting processing. If the shape of the neck portion 110b and the shape of the lateral portion 110a can be detected, the control portion 18 collates the reference shape being stored in the storage portion 32 with the detected shape of the wire 110 to determine the quality of the shape of the wire 110 (S20).

As is clear from the above description, according to the wire shape inspecting apparatus 10 disclosed in the present invention, the shape of the neck portion 110b that is difficult to be visually recognized from the camera 14 can be detected. Furthermore, the configuration described here is an example, and other configurations may be appropriately changed as long as at least the actual light emitting portion position is identified on the basis of the light emitting portion coordinate in the first inspection image and the focal distance during image-capturing and the shape of the wire 110 is identified from the actual light emitting portion position.

What is claimed is:

1. A wire shape inspecting apparatus which inspects a shape of a wire bonded between a semiconductor chip and a mounted body, comprising:
    a camera, which captures images of a wire to be inspected from a first direction;
    a light, which illuminates the wire to be inspected from the first direction; and
    a control portion, which controls the driving of the camera and the light, and identifies the shape of the wire on the basis of the images captured by the camera;
    wherein the wire has a lateral portion observable by the camera and a neck portion located on a back side of the lateral portion when viewed from the camera; and
    wherein the control portion performs
    an inspection image acquiring processing, in which a plurality of inspection images are acquired by causing the camera to capture images of the wire to be inspected a plurality of times while changing a focal distance; and
    a first shape detecting processing, in which identifying a coordinate of a light emitting portion which is an image part of reflected light where light from the light is reflected by the neck portion of the wire in one inspection image, and identifying a position of the light emitting portion in reality in a focal distance when the one inspection image is acquired as an actual light emitting portion position on the basis of the coordinate, are performed for the plurality of inspection images respectively, and actual light emitting portion positions of a plurality of focal distances are connected respectively to detect the shape of the neck portion.

2. The wire shape inspecting apparatus according to claim 1,
    wherein the control portion determines whether a lump of light is an image part of reflected light reflected by the neck portion of the wire or not on the basis of a number of the lump of light represented in the one inspection image.

3. The wire shape inspecting apparatus according to claim 2,
    wherein the control portion further
    performs a second shape detecting processing in which the position in reality of a focused portion where the image of the wire becomes clear is identified in the inspection image as an actual focused portion position on the basis of the position of the focused portion in the image and the focal distance when the inspection image is acquired; and
    wherein the control portion detects the shape of the lateral portion by the second shape detecting processing.

4. The wire shape inspecting apparatus according to claim 3,
    wherein the light comprises:
    one or more first light sources disposed on a first circle concentric with the camera; and
    one or more second light sources disposed on a second circle concentric with the camera and having a larger diameter than the first circle; and
    wherein the control portion lights the first light sources when the inspection image used in the first shape detecting processing is captured, and lights the second light sources when the inspection image used in the second shape detecting processing is captured.

5. The wire shape inspecting apparatus according to claim 3,
    wherein a change interval of the focal distance of a plurality of inspection images used in the first shape detecting processing is narrower than a change interval of the focal distance of a plurality of inspection images used in the second shape detecting processing.

6. A wire shape inspecting method which inspects a shape of a wire laid between a semiconductor chip and a mounted body, comprising:
    an arrangement step, in which a camera for capturing images of a wire to be inspected from a first direction is arranged and a light for illuminating the wire to be inspected from the first direction is arranged, the wire having a lateral portion observable by the camera and a neck portion located on a back side of the lateral portion when viewed from the camera;
    an inspection image acquiring step, in which a plurality of inspection images are acquired by causing the camera to capture images of the wire to be inspected a plurality of times while illuminating the wire to be inspected by the light and changing a focal distance; and
    a first shape detecting step, in which identifying a coordinate of a light emitting portion which is an image part of reflected light where light from the light is reflected by the neck portion of the wire in one inspection image, and identifying a position of the light emitting portion in reality in a focal distance when the one inspection image is acquired as an actual light emitting portion position on the basis of the coordinate, are performed for the plurality of inspection images respectively, and actual light emitting portion positions of a plurality of focal distances are connected respectively to detect the shape of the neck portion.

* * * * *